United States Patent
Kobayashi et al.

(10) Patent No.: US 8,236,161 B2
(45) Date of Patent: Aug. 7, 2012

(54) APPARATUS FOR ELECTROLYZING SULFURIC ACID, METHOD OF PERFORMING ELECTROLYSIS, AND APPARATUS FOR PROCESSING A SUBSTRATE

(75) Inventors: Nobuo Kobayashi, Yokohama (JP); Yukihiro Shibata, Kitakyushu (JP); Naoya Hayamizu, Yokohama (JP); Masaaki Kato, Tamano (JP)

(73) Assignees: Shibaura Mechatronics Corporation, Kanagawa (JP); Kabushiki Kaisha Toshiba, Tokyo (JP); Chlorine Engineers Corp., Ltd., Tokyo (JP)

( * ) Notice: Subject to any disclaimer, the term of this patent is extended or adjusted under 35 U.S.C. 154(b) by 615 days.

(21) Appl. No.: 12/274,681

(22) Filed: Nov. 20, 2008

(65) Prior Publication Data

US 2009/0078582 A1    Mar. 26, 2009

Related U.S. Application Data

(63) Continuation of application No. PCT/JP2008/050263, filed on Jan. 11, 2008.

(30) Foreign Application Priority Data

Jan. 15, 2007    (JP) .................................. 2007-006017

(51) Int. Cl.
*C25B 1/28*    (2006.01)
*C23G 1/00*    (2006.01)
(52) U.S. Cl. ......... 205/471; 205/472; 204/262; 204/263
(58) Field of Classification Search .................. 205/471, 205/472; 204/262, 263
See application file for complete search history.

(56) References Cited

U.S. PATENT DOCUMENTS

| | | | | |
|---|---|---|---|---|
| 3,767,046 | A | * | 10/1973 | Hartkorn ........................ 210/703 |
| 4,085,016 | A | * | 4/1978 | Janjua et al. ................... 205/472 |
| 5,634,980 | A | * | 6/1997 | Tomita et al. ..................... 134/3 |
| 6,454,929 | B1 | | 9/2002 | Thiele et al. |
| 2003/0188764 | A1 | * | 10/2003 | Haibara et al. .................... 134/2 |

FOREIGN PATENT DOCUMENTS

| | | |
|---|---|---|
| DE | 19954299 | 5/2001 |
| JP | 11269685 | 10/1999 |
| JP | 2001192874 | 7/2001 |
| JP | 2004532352 | 10/2004 |
| WO | 02088429 | 11/2002 |

OTHER PUBLICATIONS

English translation of International Preliminary Report on Patentability from parent Application No. PCT/JP2008/050263.
International Search Report from parent International Application No. PCT/JP2008/050263.

* cited by examiner

*Primary Examiner* — Arun S Phasge
(74) *Attorney, Agent, or Firm* — Volpe and Koenig, P.C.

(57) ABSTRACT

An apparatus for electrolyzing sulfuric acid, the apparatus comprising an electrolytic cell comprising a cathode chamber having a cathode and an anode chamber having an anode, the cathode chamber and the anode chamber being separated by a diaphragm, a sulfuric acid tank configured to store the sulfuric acid, a supply pipe connecting the sulfuric acid tank to an inlet port of the anode chamber, a connection pipe connecting an outlet port of the cathode chamber to the inlet port of the anode chamber, a first supply pump provided on the supply pipe and configured to supply the sulfuric acid from the sulfuric acid tank to the cathode chamber through the supply pipe, and a drain pipe connected to an outlet port of the anode chamber and configured to supply to a solution tank a solution containing an oxidizing agent generated by electrolysis in the anode chamber.

6 Claims, 2 Drawing Sheets

APPARATUS FOR ELECTROLYZING SULFURIC ACID, METHOD OF PERFORMING ELECTROLYSIS, AND APPARATUS FOR PROCESSING A SUBSTRATE

CROSS REFERENCE TO RELATED APPLICATIONS

This is a Continuation Application of PCT Application No. PCT/JP2008/050263, filed Jan. 11, 2008, which was published under PCT Article 21(2) in Japanese.

This application is based upon and claims the benefit of priority from prior Japanese Patent Application No. 2007-006017, filed Jan. 15, 2007, the entire contents of which are incorporated herein by reference.

BACKGROUND OF THE INVENTION

1. Field of the Invention

In the process of forming circuit patterns, by lithography, on a semiconductor substrate or on the substrate of a liquid crystal display, a cleaning step is performed to clean the substrate and remove, from the substrate, residues such as organic substances, metal impurities, particles and resist.

2. Description of the Related Art

In the cleaning step, the substrate is first treated with a process solution, whereby residue is removed from the substrate. Then, the substrate is cleaned with pure water or cleaning solution, removing the residues and the process solution from the substrate.

Suitable as the process solution is a solution containing an oxidizing agent such as peroxomonosulfuric acid or peroxodisulfuric acid. As is known in the art, such a solution may be obtained by adding hydrogen peroxide solution to sulfuric acid.

When hydrogen peroxide is mixed with sulfuric acid to generate the process solution, however, the concentration of the sulfuric acid may greatly decrease because the hydrogen peroxide solution is, for example, a 35% aqueous solution. If the process solution is repeatedly recovered and used again, each time mixed with a newly generated process solution, its concentration will decrease and its processing ability will be greatly reduced.

In view of this, a method of electrolyzing sulfuric acid without using hydrogen peroxide solution, thereby to generate a solution that contains an oxidizing agent has been put to practical use. Such a method is disclosed in Patent Document 1 identified below.

The apparatus for performing electrolysis, disclosed in Patent Document 1, has an electrolytic cell. The electrolytic cell is separated into an anode chamber and a cathode chamber. An anode and a cathode are provided in the anode chamber and the cathode chamber, respectively. Sulfuric acid is introduced into both the anode chamber and the cathode chamber. The sulfuric acid is subjected to electrolysis in the anode chamber, generating a solution containing an oxidizing agent. The solution thus generated is used as a process solution.

[Patent Doc. 1] Jpn. Pat. Appln. KOKAI Publication No. 2001-192874

If sulfuric acid is electrolyze, generating a process solution, as disclosed in Patent Document 1, the concentration of the process solution will scarcely decrease if repeatedly used, each time mixed with a newly generated process solution. The process solution can therefore maintain its processing ability.

In the apparatus disclosed in Patent Document 1, however, sulfuric acid is supplied to the anode chamber and the cathode chamber through different supply systems. That is, a sulfuric acid tank and a supply pump, which constitute one supply system, are connected to the anode chamber, and a sulfuric acid tank and a supply pump, which constitute another supply system, are connected to the cathode chamber. Since two supply systems are indispensable, the apparatus is inevitably complicated and large.

BRIEF SUMMARY OF THE INVENTION

An object of this invention is to provide an apparatus for electrolyzing sulfuric acid, by supplying sulfuric acid to the anode chamber and cathode chamber of an electrolytic cell through one supply system, thereby simplifying and miniaturizing the apparatus, and to provide a method of electrolyzing sulfuric acid and an apparatus for processing a substrate.

To achieve the object, an apparatus for electrolyzing sulfuric acid, according to this invention, comprises: an electrolytic cell comprising a cathode chamber having a cathode and an anode chamber having an anode, the cathode chamber and the anode chamber being separated by a diaphragm; a sulfuric acid tank configured to store the sulfuric acid; a supply pipe connecting the sulfuric acid tank to an inlet port of the anode chamber; a connection pipe connecting an outlet port of the cathode chamber to the inlet port of the anode chamber; a first supply pump provided on the supply pipe and configured to supply the sulfuric acid from the sulfuric acid tank to the cathode chamber through the supply pipe; and a drain pipe connected to an outlet port of the anode chamber and configured to supply to a solution tank a solution containing an oxidizing agent generated by electrolysis in the anode chamber.

A method of electrolyzing sulfuric acid, according to this invention, is designed to electrically decompose sulfuric acid in an electrolytic cell comprising a cathode chamber having a cathode and an anode chamber having an anode, the cathode chamber and the anode chamber being separated by a diaphragm. The method comprises: supplying the sulfuric acid to the cathode chamber; supplying the sulfuric acid from the cathode chamber to the anode chamber; and draining from the anode chamber a solution generated in the anode chamber and containing an oxidizing agent.

An apparatus for processing a substrate according to this invention is designed to process the substrate with a process solution generated by electrolyzing sulfuric acid. The apparatus comprises: an electrolysis apparatus configured to electrolyzing the sulfuric acid, thereby generating the process solution containing an oxidizing agent; a solution tank configured to store the process solution generated by electrolyzing the sulfuric acid and containing the oxidizable chemic species; and a process unit configured to process the substrate with the process solution stored in the solution tank. The electrolysis apparatus has the configuration described in claim 1.

DETAILED DESCRIPTION OF THE INVENTION

An embodiment of the present invention will be described with reference to the accompanying drawings.

Figure 1:
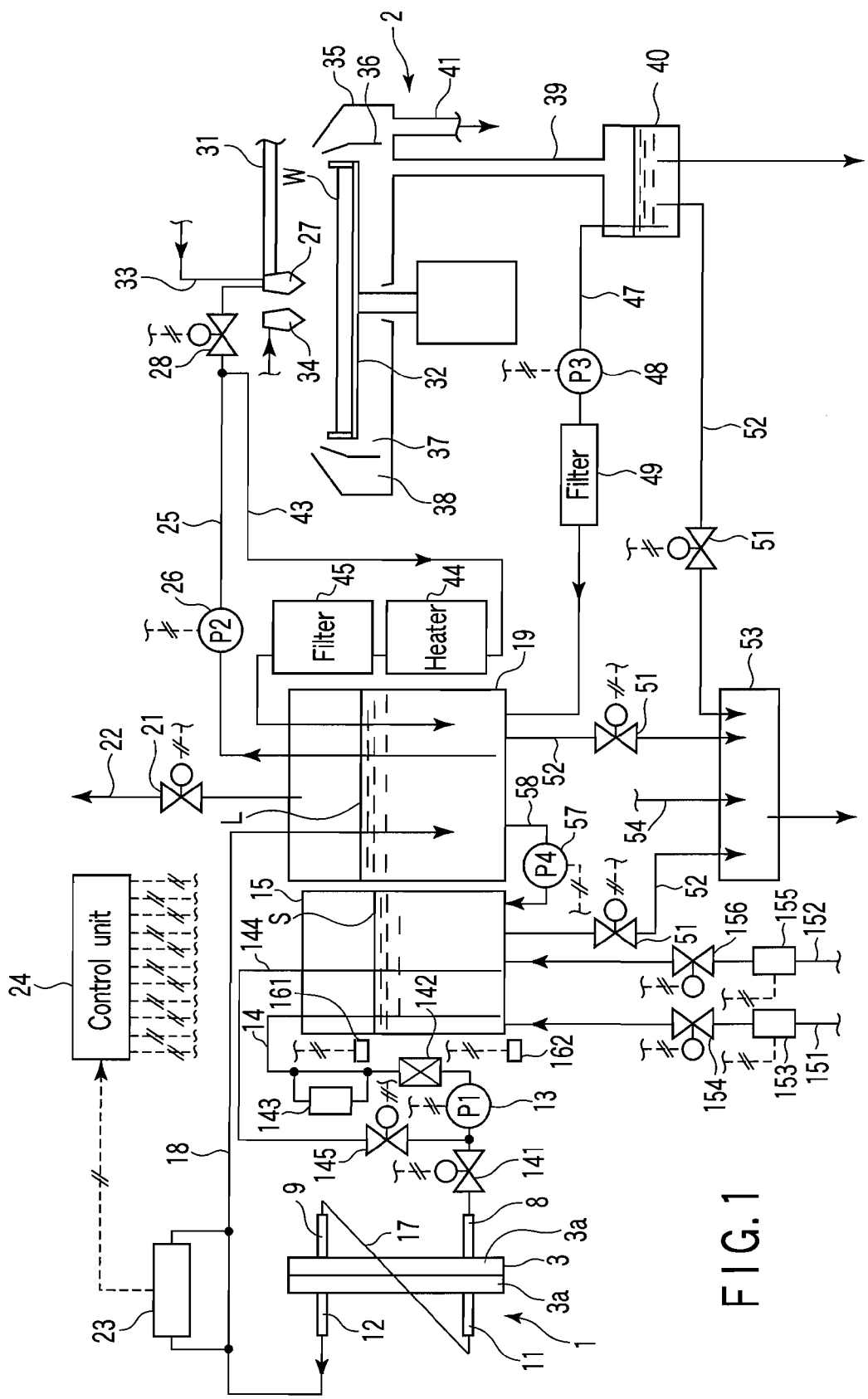
FIG. 1 is a schematic diagram showing structures of an electrolytic cell and a spin process apparatus, both according to an embodiment of the prevent invention.

FIG. 1 shows an electrolytic cell 1 and a spin process apparatus 2. The electrolytic cell 1 electrolyzes sulfuric acid and makes a process solution. Using the process solution, the spin process apparatus 2 processes a substrate W. The electrolytic cell 1 comprises a tank body 3 that is composed of a pair of vessel members 3a and a seal 3b. The vessel members 3a are combined, forming a liquid-tight tank, with the seal 3b clamped between them. The inner space of the electrolytic cell 1 is divided into a cathode chamber 5 and an anode chamber 6 by a diaphragm film 4. The diaphragm film 4 is, for example, a cation exchange membrane. The cathode chamber 5 has a cathode 5a, and the anode chamber 6 has an anode 6a.

The anode 6a is, for example, an insoluble anode (DSA), lead dioxide or conductive diamond. Electrolyzed sulfuric acid generated through electrolysis in the electrolytic cell 1 is applied directly to an object that is to be cleaned thoroughly, such as a silicon wafer having a resist formed on it. Hence, it is desired that the anode 6a be made of material from which little impurities may elute, e.g., an insoluble anode (DSA), platinum or conductive diamond. Conductive diamond is particularly desirable for the purpose of acquiring high oxygen overvoltage. This is because conductive diamond has a high ability of generating substance which is highly oxidizable, such as peroxomonosulfuric acid or peroxodisulfuric acid. On the other hand, the cathode 5a can be, for example, an insoluble anode (DSA), platinum, carbon or conductive diamond.

The cathode chamber 5 is connected to a first inflow pipe 8 at the lower end, and to a first outflow pipe 9 at the upper end. The anode chamber 6 is connected to a second inflow pipe 11 at the lower end, and to a second outflow pipe 12 at the upper end.

The first inflow pipe 8 is connected to one end of a liquid-supply pipe 14, on the middle part of which a first supply pump 13 is provided. The other end of the liquid-supply pipe 14 lies on the inner bottom of a sulfuric acid tank 15. The sulfuric acid tank 15 contains sulfuric acid S that has a concentration of 70 to 98 wt % (in mass percentage). Therefore, the sulfuric acid S in the sulfuric acid tank 15 is supplied to the cathode chamber 5 of the electrolytic cell 1 when the first supply pump 13 is driven.

A connection pipe 17 connects the first outflow pipe 9 connected to the cathode chamber 5, to the second inflow pipe 11 connected to the anode chamber 6. Therefore, the sulfuric acid S supplied from the sulfuric acid tank 15 to the cathode chamber 5 via the liquid-supply pipe 14 flows into the anode chamber 6 through the connection pipe 17.

As describing above, sulfuric acid flows into the anode chamber 6 from the cathode chamber 5. In the chamber 5, a voltage is applied between the cathode 5a and the anode 6a. The sulfuric acid is thereby electrolyzed. As a result, hydrogen is generated in the cathode chamber 5, and oxygen and a solution which contains oxidizing agent, such as peroxomonosulfuric acid or peroxodisulfuric acid, is generated in the anode chamber 6. The solution flows into a solution tank 19 from a discharge pipe 18 connected to the second outflow pipe 12, along with the hydrogen generated in the cathode chamber 5 and the oxygen generated in the anode chamber 6. The solution is stored, as process solution L, in the solution tank 19.

Note that the hydrogen generated in the cathode chamber 5 and the oxygen generated in the anode chamber 6 flow from the solution tank 19 into a catalyst tower (not shown) through a diffusion pipe 22 that is connected to the solution tank 19 and has an open valve 21. Then, the hydrogen and oxygen are diffused from the catalyst tower into the atmosphere.

A first monitor 23 is connected to the discharge pipe 18 in which the solution generated in the cathode chamber 6 is flowing. The first monitor 23 detects at least one of the properties of the solution, such as electrical conductivity, amount of the oxidizing agent and the concentration of sulfuric acid, and generates a detection signal showing at least one property detected.

The detection signal is output from the first monitor 23 to a control unit 24. The control unit 24 analyzes the detection signal, determining the properties of the solution. On the basis of the properties thus determined, the control unit 24 controls floe of the sulfuric acid per unit time. Therefore, the solution generated by electrolysis and flowing in the anode chamber 6 is fixed to a specific characteristic (ability).

On the liquid-supply pipe 14, a first flowing-path control valve 141 and a cooler 142 are provided at the outlet end and suction end of the supply pump 13, respectively. Upstream of the cooler 142, a second monitor 143 is provided, extending in parallel with the liquid-supply pipe 14. The second monitor 143 detects the concentration of sulfuric acid.

A reversion pipe 144 is connected, at one end, to a part of the liquid-supply pipe 14, which lies between the first flowing-path control valve 141 and the outlet side of the first supply pump 13. The other end of the return pipe 144 is connected to the sulfuric acid tank 15. On the middle part of the return pipe 144 a second flowing-path control valve 145 is provided.

In accordance with the concentration of sulfuric acid, detected by the second monitor 143, the control unit 24 controls the first flowing-path valve 141 and the second flowing-path valve 145, opening or closing these valves 141 and 145.

A sulfuric-acid supply pipe 151 and a diluting-liquid supply pipe 152 are connected to the sulfuric acid tank 15. Sulfuric acid is supplied to the sulfuric acid tank 15 through the sulfuric-acid supply pipe 151. A diluting liquid for diluting sulfuric acid, such as ultra-pure water, is supplied to the sulfuric acid tank 15 through the diluting-liquid supply pipe 152. On the sulfuric-acid supply pipe 151, a first flow meter 153 and a first supply control valve 154 are provided. On the diluting-liquid supply pipe 152, a second flow meter 155 and a second supply control valve 156 are provided.

The first flow meter 153 measures the amount of the sulfuric acid flowing through the sulfuric-acid supply pipe 151. The second flow meter 155 measures the amount of the diluting liquid flowing through the diluting-liquid supply pipe 152. Data items representing the amounts measured by flow meters 153 and 155 are output to the control unit 24.

In accordance with the amounts of sulfuric acid and diluting liquid, the control unit 24 opens the first supply control valve 154 and the second supply control valve 156. Sulfuric acid and diluting liquid are thereby supplied to the sulfuric acid tank 15.

To supply sulfuric acid and diluting liquid to the sulfuric acid tank 15, the control unit 24 closes the first flowing-path valve 141 and opens the second flowing-path valve 145, and activates the first supply pump 13. The sulfuric acid and the diluting liquid, both supplied to the sulfuric acid tank 15, therefore circulates, flowing through the liquid-supply pipe 14, return pipe 144 and sulfuric acid tank 15. Hence, the sulfuric acid and the diluting liquid are thoroughly stirred, whereby the concentration of the sulfuric acid in the sulfuric acid tank 15 becomes constant.

While so circulating, the sulfuric acid is cooled by the cooler 142, though heated to a high temperature with the heat generated as the sulfuric acid is diluted with the diluting liquid. This prevents the electrolytic cell 1 from being damaged by heat.

Figure 2:
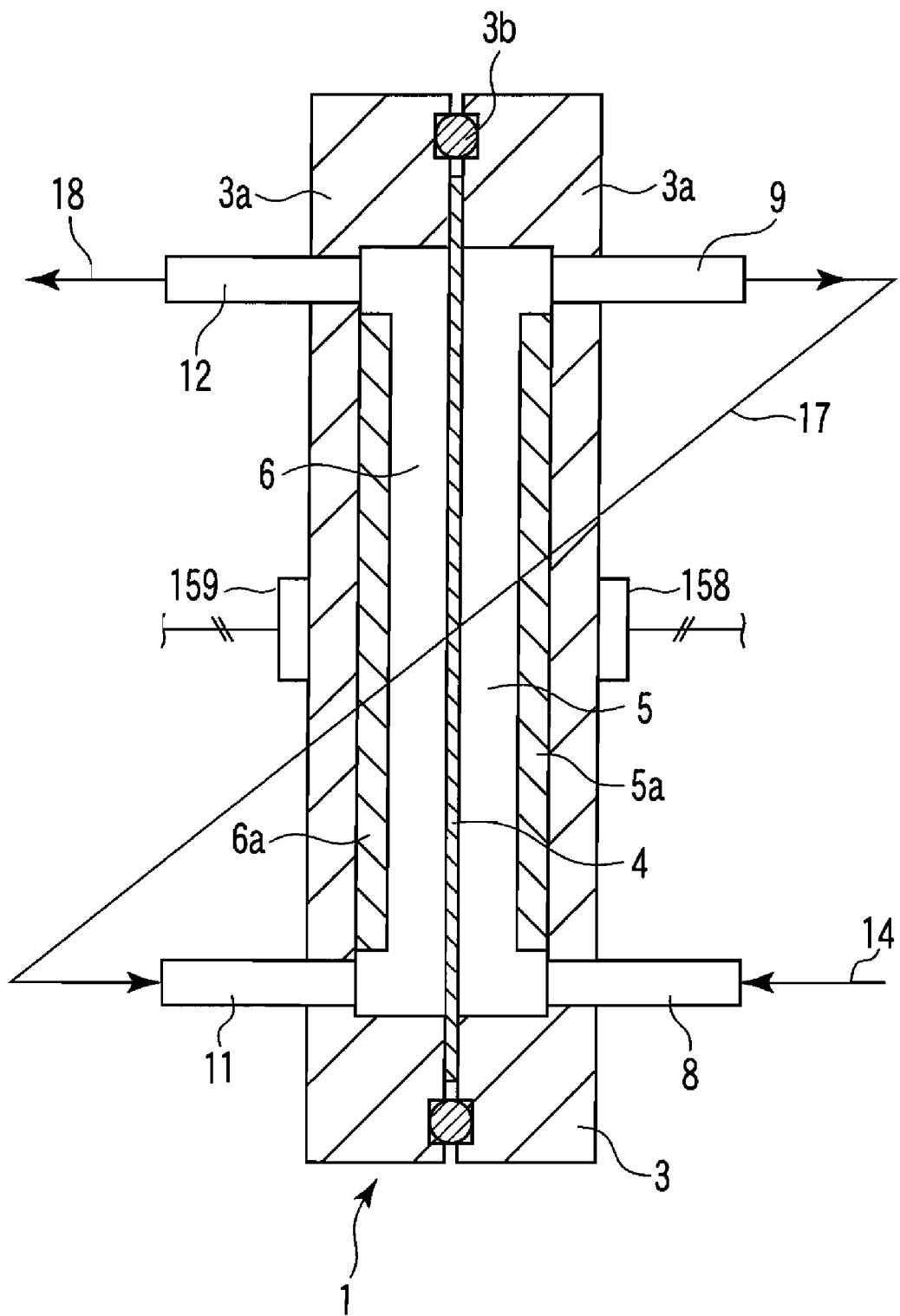
FIG. 2 is a magnified sectional view of the electrolytic cell.

The electrolytic cell 1 may be heated to a high temperature as electrolysis takes place within it. The temperature within the electrolytic cell 1 is detected by a first temperature sensor 158 and a second temperature sensor 159. As shown in FIG. 2, the first temperature sensor 158 is provided on the center of the wall of the electrolytic cell 1, which contacts the first cathode 5a, and the second temperature sensor 159 is provided on the center of the wall of the electrolytic cell 1, which contacts the anode 6a. The temperature sensors 158 and 159 generate detection signals, which are output to the control unit 24.

If the temperature measured by one of the temperature sensors rises to the endurance limit of the electrolytic cell 1, e.g., 80° C., the first flowing-path valve 141 is closed and the second flowing-path valve 145 is opened, stopping the supply of sulfuric acid to the electrolytic cell 1. The first flowing-path valve 141 has the function of preventing application of an excessive liquid pressure to the electrolytic cell 1.

The second monitor 143 detects the concentration of the sulfuric acid flowing through the return pipe 14 and generates a detection signal. This detection signal is output to the control unit 24. The concentration of the sulfuric acid is compared with a preset concentration. The amount of the sulfuric acid or diluting liquid is controlled in accordance with the result of the comparison. The concentration of the sulfuric acid stored in the sulfuric acid tank 15 is thereby set to, for example, 70 to 98 wt %, and preferably 90 wt %.

The upper and lower limits of the surface of sulfuric acid stored in the sulfuric acid tank 15 are detected by two liquid-surface sensors 161 and 162, respectively. The detection signals the liquid-surface sensors 161 and 162 generate are output to the control unit 24. When the liquid surface in the sulfuric acid tank 15 falls to the lower limit, the sulfuric acid and diluting liquid are supplied to the sulfuric acid tank 15. When the liquid surface in the sulfuric acid tank 15 rises to the upper limit, the supply of the sulfuric acid and diluting liquid is stopped. The amount of the sulfuric acid and diluting liquid therefore remains within a specific range.

A supply pipe 25 is provided, with one end located at the inner bottom of the solution tank 19. A second supply pump 26 is provided on the middle part of the supply pipe 25. The other end of the supply pipe 25 is connected via a changeover valve 28 to the first supply nozzle 27 of the spin process apparatus 2.

The first supply nozzle 27 is provided at the distal end of a swing arm 31. The swing arm 31 extends above the turntable 32 of the spin process apparatus 2. The turntable 32 holds a substrate W such as a semiconductor wafer. When driven by a drive source (not shown), the swing arm 31 moves in the radial direction of the substrate W.

A pressure pipe 33 is connected to the first supply nozzle 27 and can supply an inert gas, such as nitrogen, which is pressurized to a preset pressure. When the second supply pump 26 starts operating, the solution stored in the solution tank 19 is supplied to the first supply nozzle 27 through the supply pipe 25.

At the same time, an inert gas is supplied to the first supply nozzle 27. The solution, i.e., process solution L for processing the substrate W, is therefore sprayed by virtue of the inert gas, from the first supply nozzle 27 to the upper surface of the substrate W.

A second supply nozzle 34 is arranged above the turntable 32. A cleaning solution such as pure water is supplied to the second supply nozzle 34. After the process solution L cleans the substrate W, removing dirt from the substrate W, the second supply nozzle 34 applies the cleaning solution to substrate W. Thus, the substrate W is cleaned.

The second supply nozzle 34 may be secured to the swing arm 31, together with the first supply nozzle 27.

The turntable 32 is provided in a cup 35. The cup 35 holds an inner cup 36 shaped like a ring. The inner cap 36 can be moved up and down by a drive mechanism (not shown). The inner cup 36 partitions the interior of the cup 35 into an inner chamber 37 and an outer chamber 38.

A process-solution drain pipe 39 is connected to the bottom of the inner chamber 37. A cleaning-solution drain pipe 41 is connected to the bottom of the outer chamber 38. To process the substrate W with the process solution, the inner cup 36 is moved up so that its top may be located above the substrate W.

Once the inner cup 36 has been so moved, the process solution L applied from the first supply nozzle 27 to the upper surface of the rotating substrate W scatters from the circumference of the substrate W, collides with the inner circumferential surface of the inner cup 36, and falls onto the bottom of the cup 35. The process solution L is then drained from the cup 35 through the process-solution drain pipe 39 that is connected to the bottom of the inner chamber 37. The process solution L thus drained is stored in a first drain tank 40.

To clean the substrate W with the cleaning solution applied from the second supply nozzle 34, the inner cup 36 is lowered so that its top may be located below the substrate W. Therefore, the cleaning solution applied from the second supply nozzle 34 to the substrate W scatters from the circumference of the substrate W and falls into the outer chamber 38 of the cup 35. The cleaning solution is then drained from the cap 35 through the cleaning-solution drain pipe 41 connected to the bottom of the outer chamber 38.

The substrate W need not be processed with process solution L. In this case, the changeover valve 28 provided on the supply pipe 25 is closed. A first return pipe 43 is connected, at one end, to the upstream end of the supply pipe 25, which lies near the changeover valve 28.

The other end of the first return pipe 43 is connected to the solution tank 19. On the first return pipe 43, a heater 44 and a filter 45 are provided. When the changeover valve 28 is closed, the process solution L the second supply pump 26 supplies from the solution tank 19 to the supply pipe 25 flows back into the solution tank 19 through the first return pipe 43. While the process solution L is flowing, the heater 44 heats the solution L and the filter 45 removes dust from the solution L. Therefore, the process solution L heated to a prescribed temperature and rendered clean is stored in the solution tank 19.

A second return pipe 47 is connected, at one end, to the first drain tank 40. The other end of the second return pipe 47 is connected to the solution tank 19. A third supply pump 48 and a filter 49 are provided on the middle part of the second return pipe 47. The pump 48 can therefore supply the process solution L drained from the cup 35 to the first drain tank 40, back into the solution tank 19 through the filter 49.

The sulfuric acid tank 15, solution tank 19 and first drain tank 40 are connected to a second drain tank 53 by three drain pipes 52, respectively. Three open/close valves 51 are provided on these drain pipes 52, respectively. Thus, the process solution L used and no longer necessary can be drained into the second drain tank 53. A diluting liquid pipe 54 is connected to the second drain tank 53, and supplies industrial water, as a diluting liquid, into the second drain tank 53. The diluting liquid thus supplied dilutes the process solution, forming a diluted solution that is, for example, 20 times as large in amount as the of process solution. The diluted solution is cooled and then discarded.

The bottom of the sulfuric acid tank 15 and the bottom of the solution tank 19 are connected by a return pipe 58, to while a fourth supply pump 57 is connected at its middle part. Controlled by a timer (not shown), the fourth supply pump 57 intermittently operates at regular intervals, supplying the process solution L from the solution tank 19 back into the sulfuric acid tank 15.

The process solution L stored in the solution tank 19 may change with time to another substance whose chemical species is oxidizable, the cleaning ability of which may therefore lower. This is why the fourth supply pump 57 supplies the processing solution L from the solution tank 19 back into the sulfuric acid tank 15 at regular intervals, so that the process solution L may be re-used. That is, the process solution L changed in quality with time while being stored in the solution tank 19 can be used again or discharged through the drain pipe 52.

The first to third supply pumps 13, 26 and 48, the open valve 21, the changeover valve 28, and the three open/close valves 51 provided on the three drain pipes 52, respectively, are opened or closed by the control unit 24.

In the electrolytic cell 1 so configured as described above, the connection pipe 17 connects the cathode chamber 5 and the anode chamber 6 in series. Hence, if the first supply pump 13 provided on the return pipe 14 is driven, the sulfuric acid S can be supplied from the sulfuric acid tank 15 into the cathode chamber 5 and then into the cathode chamber 6. The sulfuric acid S can therefore be electrolyzed.

That is, the sulfuric acid S can be electrolyzed only if supplied into the cathode chamber 5 by the first supply pump 13. The electrolytic cell 1 can therefore be simpler and smaller as a whole than in the case where sulfuric acid S is supplied to both the cathode chamber 5 and the anode chamber 6 through different paths.

The solution generated through the electrolysis in the anode chamber 6 is examined for its properties, by means of the monitor 23. From the detection signal the monitor 23 generates, the control unit 24 determines the properties of the solution, such as electrical conductivity and the concentration of sulfuric acid. Based on these properties determined, the control unit 23 controls the first supply pump 13, controlling the flow of sulfuric acid S per unit time in the electrolytic cell 1.

The time for electrolyzing a unit amount of sulfuric acid S in the anode chamber 5 can thereby be controlled. Hence, the solution generated as the electrolysis proceeds in the anode chamber 5 remain unchanged in terms of properties. Thus, a solution constant in properties can be stored, as process solution L, in the solution tank 19.

The process solution L stored in the solution tank 19 is applied to the substrate W held on the turntable 32 of the spin process apparatus 2. After being processed with the process solution L, the substrate W is cleaned with the cleaning solution.

The substrate W is appropriately processed with the process solution L if the sulfuric acid S stored in the sulfuric acid tank 15 has a concentration of 70 to 98 wt %, and best processed if the sulfuric acid S has a concentration of 90 wt %, as has been confirmed by experiments.

The inner cup 36 provided in the cup 35 is moved up before the substrate W is processed with the process solution L, and is moved down before the substrate W is cleaned with cleaning solution. The process solution L and the cleaning solution can therefore be recovered independently. The process solution L recovered can be supplied back into the solution tank 19 and can therefore be re-used. This can make the spin process apparatus 2 economical.

If the process solution L need not be applied to the substrate W, the changeover valve 28 may be closed. Then, the process solution L the second supply pump 26 has supplied from the solution tank 19 to the supply pipe 25 can be supplied back into the solution tank 19 through the first return pipe 43. Thus, as long as the process solution L remains not used, it is circulated through the first return pipe 43 and maintained at a prescribed temperature by the heater 44.

Therefore, the process solution L does not remain in the supply pipe 25 long enough for it to be cooled. Thus, the process solution L heated to the prescribed temperature can be immediately used again, and applied to the substrate W, when the changeover valve 28 is opened.

The present invention is not limited to the embodiment described above. The apparatus for processing the substrate, for example, is not limited to a spin process apparatus. It may be any other process apparatus, such as an apparatus for processing substrates that are transported horizontally, or a batch process apparatus for processing substrates all immersed in the process solution at the same time.

In the present invention, a connection pipe connects the sulfuric-acid outlet port of the cathode chamber to the sulfuric-acid inlet port of the anode chamber. Through the connection pipe, the sulfuric acid pressurized by a pump is supplied first into the cathode chamber and then into the anode chamber. In the anode chamber, the sulfuric acid is electrolyzed.

An oxidizable solution can therefore be generated, merely by supplying sulfuric acid to the cathode chamber and electrolyzing the sulfuric acid in the anode chamber. The electrolysis apparatus can therefore be simpler and smaller than in the case where the sulfuric acid is supplied to both the cathode chamber and the anode chamber through different paths.

Moreover, the oxidizing agent generated through anodic oxidation cannot contact the cathode and cannot be reduced into sulfate ions, because the sulfuric acid flows from the cathode chamber to the anode chamber. Therefore, the oxidizing agent can be generated at high efficiency.

What is claimed is:

1. An apparatus for electrolyzing sulfuric acid, comprising:
    an electrolytic cell comprising a cathode chamber having a cathode and an anode chamber having an anode, the cathode chamber and the anode chamber being separated by a diaphragm;
    a sulfuric acid tank configured to store the sulfuric acid;
    a supply pipe connecting the sulfuric acid tank to an inlet port of the cathode chamber;
    a connection pipe connecting an outlet port of the cathode chamber to the inlet port of the anode chamber;
    a first supply pump provided on the supply pipe and configured to supply the sulfuric acid from the sulfuric acid tank to the cathode chamber through the supply pipe;
    a drain pipe connected to an outlet port of the anode chamber and configured to supply to a solution tank a process solution containing an oxidizing agent generated by electrolysis in the anode chamber;
    measuring means for measuring at least one of electrical conductivity, an amount of the oxidizing agent and a concentration of the sulfuric acid of the process solution generated by electrolysis, flowing in the drain pipe and containing the oxidizing agent; and
    control means for maintaining the amount of the sulfuric acid supplied by the first supply pump to maintain the process solution generated by electrolysis in the anode chamber constant in terms of properties, in accordance with the results of the measuring performed by the measuring means;
    wherein the process solution stored in the solution tank is supplied to a process unit through a second supply pipe on which a second supply pump is provided and is supplied back to the solution tank through a first return pipe when the process solution is not used in the process unit, and heating means is provided on the first return pipe to control the temperature of the process solution being supplied back to the solution tank.

2. The apparatus for electrolyzing sulfuric acid, according to claim 1, further comprising a sulfuric-acid supplying pipe configured to supply sulfuric acid to the sulfuric acid tank and a diluting-liquid supply pipe configured to supply to the sulfuric acid tank diluting liquid for diluting the sulfuric acid, wherein the control means controls the amount of the sulfuric acid supplied through the sulfuric-acid supplying pipe and the amount of the diluting liquid supplied through the diluting-liquid supply pipe, thereby to control the concentration of the sulfuric acid stored in the sulfuric acid tank.

3. An apparatus for processing a substrate with a process solution generated by electrolyzing sulfuric acid, comprising:
the apparatus for electrolyzing configured to electrolyzing the sulfuric acid of claim 1; thereby generating the process solution containing an oxidizing agent;
the solution tank stores the process solution containing the oxidizing agent; and
the process unit processes the substrate with the process solution stored in the solution tank.

4. The apparatus for processing a substrate, according to claim 3, wherein the process unit is a spin process apparatus configured to process the substrate with the process solution, while rotating the substrate, clean the substrate with a cleaning solution, recover the process solution and the cleaning solution independently, and supply the process solution recovered back to the solution tank through a second return pipe.

5. The apparatus for processing a substrate, according to claim 3, wherein the oxidizing agent is peroxornonosulfuric acid or peroxodisulfuric acid.

6. A method of electrolyzing sulfuric acid in an electrolytic cell comprising a cathode chamber having a cathode and an anode chamber having an anode, the cathode chamber and the anode chamber being separated by a diaphragm, the method comprising:
supplying the sulfuric acid to the cathode chamber;
supplying the sulfuric acid from the cathode chamber to the anode chamber;
draining from the anode chamber to a solution tank a solution generated in the anode chamber and containing an oxidizing agent;
measuring at least one of electrical conductivity, an amount of the oxidizing agent and a concentration of the sulfuric acid of the solution generated by electrolysis, flowing in the drain pipe and containing the oxidizing agent; and
maintaining the amount of the sulfuric acid supplied by the first supply pump to maintain the solution generated by electrolysis in the anode chamber constant in terms of properties, in accordance with results of the measuring of properties of the solution;
wherein the solution stored in the solution tank is supplied to a process unit through a second supply pipe on which a second supply pump is provided and is supplied back to the solution tank through a first return pipe when the process solution is not used in the process unit, and heating means is provided on the first return pipe to control the temperature of the process solution being supplied back to the solution tank.

* * * * *